United States Patent [19]
Kohama

[11] Patent Number: 5,917,362
[45] Date of Patent: Jun. 29, 1999

[54] SWITCHING CIRCUIT

[75] Inventor: Kazumasa Kohama, Kanagawa, Japan

[73] Assignee: Sony Corporation, Japan

[21] Appl. No.: 09/010,041

[22] Filed: Jan. 21, 1998

[30] Foreign Application Priority Data

Jan. 29, 1996 [JP] Japan .................................. 9-015385
Jan. 22, 1997 [JP] Japan .................................. 9-009051

[51] Int. Cl.$^6$ .................................. H04B 1/44; H04J 3/02
[52] U.S. Cl. .......................... 327/408; 327/415; 327/403; 327/404; 333/103; 370/480; 455/78
[58] Field of Search .................................. 327/408, 416, 327/407, 403, 404, 365; 333/103, 262; 370/480; 455/78

[56] References Cited

U.S. PATENT DOCUMENTS 5,504,745  4/1996  Petz et al. .............................. 327/408

*Primary Examiner*—Dinh T. Le
*Attorney, Agent, or Firm*—Rader, Fishman & Grauer; Ronald P. Kananen

[57] ABSTRACT

Switches are provided on the input and output side of an amplification stage in a signal switching circuit provided in a signal transmission line, and another signal is provided so that a signal can be transmitted directly. Further, a switching circuit is formed from FET elements, which are controlled to be switched on/off by control signals to assure a high isolation.

11 Claims, 15 Drawing Sheets

F I G. 15
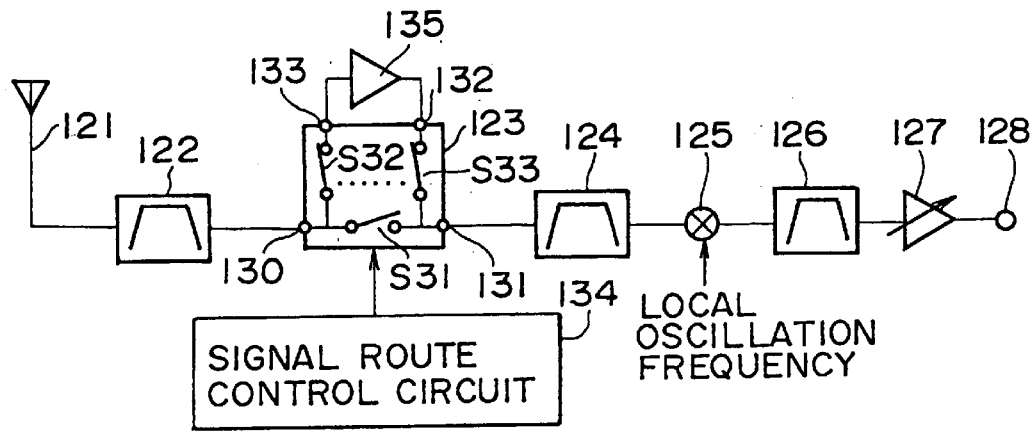
F I G. 16
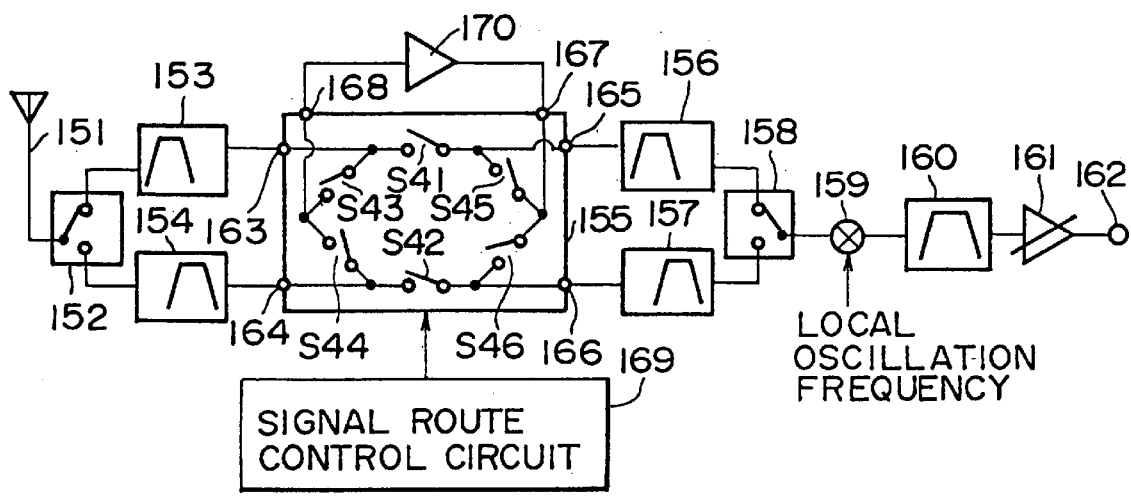

SWITCHING CIRCUIT

BACKGROUND OF THE INVENTION

This invention relates to a switching circuit which handles a high frequency such as a microwave, and more particularly to a switching circuit which is suitably used where a high isolation is required or where a matching state is required upon switching off.

In radio communication in a cellular system or the like, the signal level is varied every moment by a variation of the distance to a base station, by an influence of fading which occurs in a transmission line or the like. In a terminal, it is a common practice to adjust a received signal which exhibits such a level variation to a fixed signal level by absorbing a variation of the level by a gain adjustment element, such as an amplifier or an attenuator, with which gain adjustment can be performed and then transmit the signal of the adjusted level to a demodulator. On the other hand, in transmission, in order to supply a fixed signal level to a base station, it still is a common practice to adjust a signal to a desired level by a gain adjustment element and then transmit the signal of the adjusted level as a signal output of the terminal.

From such demands as described above, generally a terminal is essentially required to have some gain adjustment element for both transmission and reception. However, the required adjustment width in gain is different among different systems. If the variation width in gain required by a system extends over 80 dB to 90 dB, then from the limitations in isolation, dynamic range and so forth of a device, it is very difficult to realize the variation width of a signal by means of a single gain adjustment element when the possibility in realization or the cost is taken into consideration.

Therefore, it is common to realize such a variation width of a signal by dividing a gain adjustment element into a plurality of elements. Referring to FIG. 1, there is shown a transmission system for radio communication such as a cellular system in which such common measures are employed.

If it is assumed that the system requires gain adjustment of a transmission signal by 80 dB, then a level variation of a signal by 80 dB must be exhibited at an input terminal 9a of a transmission antenna 9. Therefore, the level variation of a signal by 80 dB is distributed such that, for example, gain adjustment by 50 dB is performed by an intermediate frequency (IF) stage and gain adjustment by the remaining 30 dB is performed by a high frequency (radio frequency; RF) stage.

More particularly, an IF signal of a fixed level inputted from a terminal 1 is supplied through an IF signal line 2 to a first variable gain amplifier 3, by which gain adjustment is performed in the width of 50 dB. Then, the IF signal from the first variable gain amplifier 3 is mixed with a local oscillation frequency by a frequency mixer 4 so that it is frequency converted into a RF signal, and then, unnecessary frequency components, such as an image signal or the like, are removed from the RF signal by a band-pass filter 5.

The RF having passed through the band-pass filter 5 undergoes gain adjustment in the width of 30 dB by a second variable gain amplifier 6 and then undergoes fixed signal amplification by a power amplifier 7, after which whereafter it is supplied with a desired output power to the transmission antenna 9 through a band-pass filter 8. In this instance, the level difference of the variation of the transmission signal of the devices from the input terminal 1 of the transmission system to the input terminal 9a of the transmission antenna 9 may be 50 dB in the maximum.

By dividing the gain adjustment element into the first variable gain amplifier 3 and the second variable gain amplifier 6 and compressing the difference between the maximum level and the minimum level of a signal at each of nodes from the input terminal 1 of the transmission system to the input terminal 9a of the transmission antenna 9 in this manner, the dynamic range of each element can be minimized.

Meanwhile, a transmission system of a construction wherein a pass-band of a band-pass filter is divided into a plurality of subbands is known in the art. A transmission system of the type just described is provided because, when each of the band-pass filters 5 and 8 of FIG. 1 is to be implemented, depending upon a frequency characteristic required for a filter of a system, if it is intended to implement the filter with a single device, the filter requires a physically very large volume, resulting an electrically high loss in the pass band.

In particular, in order to eliminate such a problem as just described, the transmission system of FIG. 1 is modified such that, as seen in FIG. 2, dividing the pass-band of each of the band-pass filters 5 and 8 into two subbands, band-pass filters 5a, 5b and 8a, 8b having different pass bands are provided in place of the band-pass filters 5 and 8, respectively, and single pole double throw (SPDT) switches 10, 11 and 12, 13 are provided on the input and output sides of the band-pass filters 5a, 5b and 8a, 8b, respectively, so that one of two routes may be selected in each stage in accordance with a frequency of a signal. In this instance, even if the volumes or losses of the SPDT switches 10, 11 and 12, 13 are discounted, it is sometimes possible to realize a filter of a small volume and a low loss, and this is advantageous in space savings and power savings as an entire system.

However, in the transmission system described above with reference to FIG. 1 wherein gain adjustment is performed by the two variable gain amplifiers 3 and 6, power must always be supplied to the two variable gain amplifiers 3 and 6. Particularly with the power amplifier 7, since the power load efficiency at a low signal input level generally exhibits a remarkable drop, even if gain adjustment is performed by the variable gain amplifier 6, a further loss in power consumption is invited. This causes a serious problem in a radio communication system such as a cellular system from the point of view of assurance of a service time of a terminal.

Further, with the transmission system described above with reference to FIG. 2, since the SPDT switches 10, 11 and 12, 13 must be provided to switch the band-pass filters 5a, 5b and 8a, 8b, respectively, an increased number of parts and an increased mounting area are required. This causes a serial problem with a portable terminal to which a strong demand for minimization is directed. It is to be noted that, while the examples of division of a gain adjustment element into a plurality of elements described above with reference to FIGS. 1 and 2 are applied to a transmission system, such division can be applied quite similarly also to a reception system.

Further, use of a field effect transistor (FET) made of gallium arsenite (GaAs) as a switching element of a switching circuit which handles a high frequency such as a microwave is increasing. Particularly, from an anticipation for reduction in size, augmentation in performance and reduction in cost of a circuit by integration and so forth, a monolithic microwave integrated circuit (MMIC) switch is considered significant.

For switching ICs, different circuit constructions are adopted depending upon the performances, functions and so forth required for them. Generally, an equivalent circuit to switching FETs made of GaAs is simply represented as resistors Ron connected in series when it is on, but as capacitors Coff connected in series when it is off. As an example, the resistors Ron in an on-state are approximately 2 Ωmm, and the capacitors Coff in an off-state are approximately 300 fF/mm.

Recently, personal communication using a portable telephone terminal or the like has spread widely. For such personal communication, communication bands lower than 2 GHz are used in almost all cases. Where a comparatively high isolation is required in such a frequency band as just mentioned and when it is necessary to establish 50 Ω matching with a port in an off-stage, a switching circuit having such a circuit construction as shown, for example, in FIG. 3 is used.

In particular, referring to FIG. 3, an FET Q11 and another FET Q12 are connected in series between a first input/output terminal 21 and a second input/output terminal 22. A shunt FET Q13 is connected between a common junction between the FETs Q11 and Q12 and the ground, and another shunt FET Q14 is connected in series to a resistor R19 between the second input/output terminal 22 and the ground. Resistors R11 to R14 are connected to the gates of the FETs Q11 to Q14, respectively.

Similarly, an FET Q15 and another FET Q16 are connected in series between the first input/output terminal 21 and a third input/output terminal 23. A shunt FET Q17 is connected between a common junction between the FETs Q15 and Q16 and the ground, and another shunt FET Q18 is connected in series to a resistor R20 between the third input/output terminal 23 and the ground. Resistors R15 to R18 are connected to the gates of the FETs Q15 to Q18, respectively.

In order to create a conductive path between the first input/output terminal 21 and the second input/output terminal 22 in the circuit having such a construction as described above, the FETs Q11 and Q12 and the shunt FETs Q17 and Q18 are put into an on-state while the shunt FETs Q13 and Q14 and the FETs Q15 and Q16 are put into an off-state. Since the FETs Q11 and Q12 are in an on-state, no loss is exhibited by this route. Meanwhile, since the shunt FETs Q13 and Q14 are in an off-state, a small signal leaks from this route to the ground. Accordingly, the route between the first input/output terminal 21 and the second input/output terminal 22 is put into a conducting state.

On the other hand, in a path between the first input/output terminal 21 and the third input/output terminal 23, since the FETs Q15 and Q16 are in an off-state, this path is in a non-conducting state. However, as the signal frequency increases, a signal leaks through off capacitances of the FETs Q15 and Q16 and the isolation characteristic is deteriorated. Therefore, the shunt FET Q17 is provided so that, as the shunt FET Q17 is put into an on-state, a signal leaking to the series FET Q15 is pulled in to the ground, and consequently, a high isolation can be assured. Further, the shunt FET Q18 in an on-state pulls in a signal leaking from the series FET Q16 to the ground and thus augments the isolation.

Meanwhile, the impedance as viewed from the third input/output terminal 23 appears to be 50 Ω since approximately only the resistor R20 (=50 Ω) appears because the impedance on the inner side of the IC than the FET Q16 does not appear due to the presence of the FET Q16, which is in an off-state, and if the impedance of the transmission line is 50 Ω, then the impedances match each other. As described above, 50 Ω matching of an off port and a high isolation can be realized by the circuit of FIG. 3. The isolation characteristic of the circuit of FIG. 3 is illustrated in FIG. 4. As apparently seen from FIG. 4, the isolation at 2 GHz is as high as 66 dB.

In the circuit examples described above, it is assumed that mounting of the FET switches is ideal. Actually, however, various parasitic components are involved and cannot be ignored. For example, in a portable telephone terminal or the like, as the price decreases, a reduction of the cost for an IC used is also demanded. Therefore, since a ceramic package or the like, which has superior high frequency characteristics does not satisfy such a demand for reduction in cost, a plastic mold package is used in most cases. Where a plastic mold package is used, parasitic components which particularly have an influence on characteristics of a switch are inductance components which exist in series between signal terminals or a ground terminal of an IC and the outside of the IC. Such inductance components arise from wires for connection between the IC chip and I/O pins of the package, pins of the package and so forth. For example, an inductance of 1 nH or more is provided by one wire.

FIG. 5 is a circuit diagram showing a circuit wherein a common ground is provided on a chip. Referring to FIG. 5, like elements to those of FIG. 3 are denoted by like reference symbols. Where a common ground is used on a chip in this manner, a parasitic inductance Lb is provided between the common ground on the chip and the ground outside the IC. An isolation characteristic in this instance is illustrated in FIG. 6. From FIG. 6, it can be seen that the isolation is deteriorated significantly by a small parasitic inductance. For example, the isolation is deteriorated to 33 dB by the parasitic inductance Lb of 0.5 nH.

The reason is that, since the parasitic inductance Lb is provided between the common ground on the chip and the ground outside the IC, the common ground on the chip does not sufficiently act as the ground. As an example, a case wherein the route between the first input/output terminal 21 and the second input/output terminal 22 is rendered conducting is described. In this instance, a signal leaks to the common ground on the chip from the shunt FETs Q13 and Q14 on the on-state side and also from the shunt FET Q17 on the off-state side. Since the common ground on the chip does not sufficiently act as the ground, the leaking signal leaks to the third input/output terminal 23 through the shunt FET Q18 in an on-state thereby to deteriorate the isolation. In this manner, it is difficult to obtain a high isolation with a circuit on which a common ground is provided on a chip.

A circuit having such a circuit construction as shown in FIG. 7 has been proposed to prevent such deterioration in isolation as described above. Referring FIG. 7, the circuit shown is constructed such that the ground sides of shunt FETs Q13, Q14, Q17 and Q18 are directly connected to an ideal ground through a parasitic inductance Lb. Actually, the circuit is constructed such that the ground sides of the shunt FETs Q13, Q14, Q17 and Q18 on an IC are directly connected to I/O pins of the IC by wires. As apparently seen from FIG. 8, the isolation characteristic in this instance is improved very much.

As an example, where the parasitic inductance Lb is 0.5 nH, an isolation of approximately 60 dB is obtained. In this instance, however, since a number of I/O pins equal to the number of shunt FETs are required, the number of pins of the package increases, resulting in increase in size of the package. This is inconvenient for a device for which minimization is required such as a portable terminal.

Also another technique wherein grounds on an IC are formed independently of each other and individually connected to a die pad which serves as the ground of the IC by wires is available. This technique can improve the isolation and decrease the number of I/O pins of an IC package. However, as can be seen from FIG. 6, the isolation is deteriorated significantly by a little parasitic inductance Lb, and presence of a parasitic inductance of some magnitude between the die pad and an ideal ground outside the IC cannot be avoided although it is not so high as that provided by a wire. As a result, a very high isolation characteristic cannot be obtained.

If a switching circuit which is used in a quasi microwave band is constructed such that grounds on the chip are formed common as seen in FIG. 5, it is difficult to obtain a high isolation. In this instance, if the number of wires for connection between the common ground and a die pad of the packet is increased, then the isolation can be improved. However, as can be seen from FIG. 8, a very high isolation cannot be obtained.

Further, if the number of wires is increased, then although the inductances of the wires decrease and the isolation characteristic is improved considerably, since the number of pads for the wires on the chip increases, the chip size increases, resulting in an increase in cost. Further, where the circuit construction of FIG. 7 is employed, since the number of pins of the package increases, an increase in the package size also occurs. This is particularly inconvenient for such a device for which minimization is required such as a portable terminal. As described above, it is difficult to realize achievement of a high isolation, reduction in cost and minimization of a device in a quasi microwave band.

SUMMARY OF THE INVENTION

It is an object of the present invention to provide a signal processing circuit which can achieve significant reduction of the power consumption and can contribute to reduction in mounting area, reduction in number of parts and reduction in cost.

It is another object of the present invention to provide a switching circuit which has a very high isolation characteristic even where an inexpensive plastic mold package is employed.

In order to attain the objects described above, according to an aspect of the present invention, there is provided a signal processing circuit, comprising signal switching means including a first input terminal group including one or more input terminals, a first output terminal group including an output terminal which corresponds one by one to each of the input terminals of the first input terminal group, a second input terminal group including one or more input terminals, a second output terminal group including an output terminal which corresponds one by one to each of the input terminals of the second input terminal group, a first switch group for selectively connecting corresponding ones of the input terminals of the first input terminal group and the output terminals of the first output terminal group, a second switch group for selectively connecting the input terminals of the first input terminal group and the output terminals of the second output terminal group, and a third switch group for selectively connecting the input terminals of the second input terminal group and the output terminals of the first output terminal group, signal route control means for controlling on/off-states of the switches of the first, second and third switch groups, and signal routes having different gains from each other for connecting the output terminals of the second output terminal group and the input terminals of the second input terminal group.

In the signal processing circuit, the signal route control means suitably controls on/off-states of the switches of the first, second and third switch groups of the signal switching means. In particular, the signal switching means either switches on a desired one of the switches of the first switch group to connect a pair of corresponding ones of the input and output terminals of the first input terminal group and the first output terminal group or switches on corresponding the switches of the second and third switch groups to connect selected ones of the input and output terminals of the first input terminal group and the second output terminal group and connect selected the input and output terminals of the second input terminal group and the first output terminal group.

In other words, in the signal switching means, either one of the signal routes having different gains is selected or a pair of corresponding the input and output terminals of the first input terminal group and the first output terminal group under the control of the signal route control means. As a result, the gain when the first input terminal group is viewed from the first output terminal group is 0 where a pair of corresponding the input and output terminals of the first input terminal group and the first output terminal group are connected directly to each other, but it varies depending upon selection of a signal route where corresponding switches of the second and third switch groups are switched on.

According to another aspect of the present invention, there is provided a switching circuit which is formed as an IC, comprising first, second and third input/ output terminals, a first signal route including two or more switching elements connected in series between the first and second input/output terminals, a second signal route including two or more switching elements connected in series between the first and third input/output terminals, a first switching element connected between that end of one of the switching elements in the first signal route adjacent the first input/output terminal which is adjacent the second input/output terminal and a common ground on a chip, a second switching element connected between that end of another one of the switching elements in the first signal route adjacent the second input/output terminal which is adjacent the second input/output terminal and a ground outside the IC, a third switching element connected between that end of one of the switching elements in the second signal route adjacent the first input/output terminal which is adjacent the third input/output terminal and the common ground on the chip, and a fourth switching element connected between that end of another one of the switching elements in the second signal route adjacent the third input/output terminal which is adjacent the third input/output terminal and the ground outside the IC.

In the switching circuit, since the ground sides of the first and third switching elements in the first and second signal routes adjacent the first input/output terminal are connected to the common ground on the chip, the lengths of wires for connection of the ground sides of the first and third switching elements to a die pad can be shortened and the number of pins of an IC package can be reduced. Further, since the ground sides of the second and fourth switching elements in the first and second signal routes adjacent the second and third input/output terminals are connected to the ground outside the IC, no drawing around of a signal from an insufficient ground occurs.

The above and other objects, features and advantages of the present invention will become apparent from the following description and the appended claims, taken in conjunction with the accompanying drawings in which like parts or elements are denoted by like reference numerals.

BRIEF DESCRIPTION OF THE DRAWINGS

FIG. 15 is a block diagram of a reception circuit of a radio communication system in which the signal processing circuit of FIG. 9 is incorporated;

FIG. 16 is a block diagram of another reception circuit of a radio communication system in which the signal processing circuit of FIG. 9 is incorporated;

DETAILED DESCRIPTION OF THE PREFERRED EMBODIMENTS

Figure 9:
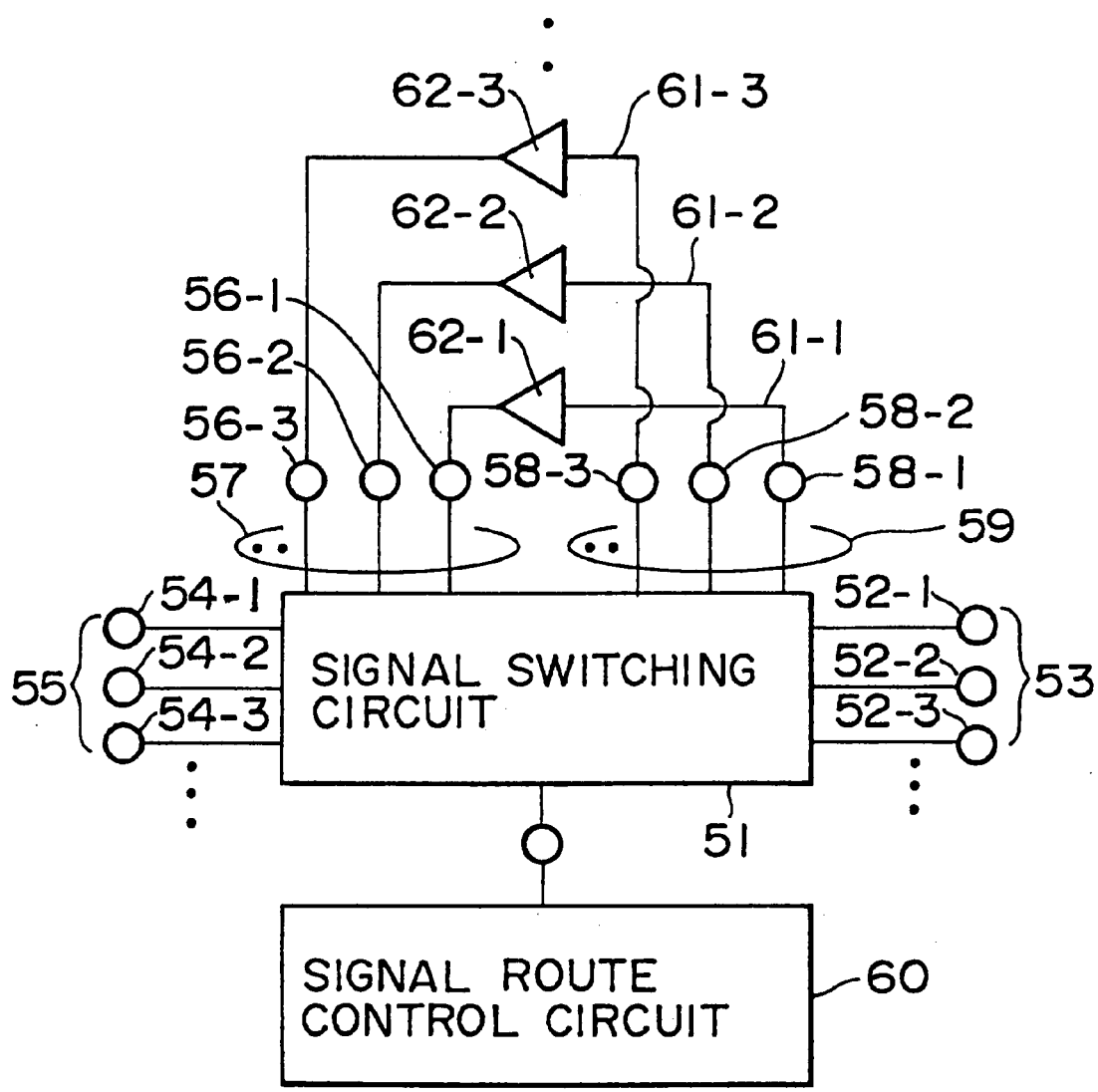
FIG. 9 is block diagram of a signal processing circuit to which the present invention is applied.

Referring first to FIG. 9, there is shown in block diagram a signal processing circuit to which the present invention is applied. The signal processing circuit shown includes a signal switching circuit 51 formed from a set of switching elements such as chemical semiconductor field effect transistors (FETs). The signal switching circuit 51 has a first input terminal group 53 including a plurality of input terminals 52-1, 52-2, 52-3, . . . , a first output terminal group 55 including output terminals 54-1, 54-2, 54-3, . . . which correspond one by one to the input terminals 52-1, 52-2, 52-3, . . . of the first input terminal group 53, respectively, a second input terminal group 57 including a plurality of input terminals 56-1, 56-2, 56-3, . . . , and a second output terminal group 59 including output terminals 58-1, 58-2, 58-3, . . . which correspond one by one to the input terminals 56-1, 56-2, 56-3, . . . of the second input terminal group 57, respectively.

The signal switching circuit 51 is controlled to be switched by a signal route control circuit 60. More particularly, the signal switching circuit 51 performs switching control of signal routes such that it selects one input terminal 52-i (i is an arbitrary number) from within the first input terminal group 53 and one output terminal 54-i in the first output terminal group 55 which is paired with the input terminal 52-i and either connects them directly to each other or connects the selected input terminal 52-i in the first input terminal group 53 to an output terminal 58-i in the second output terminal group 59 which is paired with the input terminal 52-i and connects an input terminal 56-i in the second output terminal group 59 which is paired with the output terminal 58-i and the output terminal 54-i in the first output terminal group 55 which is paired with the input terminal 56-i to each other.

Further, in signal routes 61-1, 61-2, 61-3, . . . between the output terminals 58-1, 58-2, 58-3 of the second output terminal group 59 and the input terminals 56-1, 56-2, 56-3, . . . of the second input terminal group 57, amplifiers 62-1, 62-2, 62-3, . . . which have different gains from each other and whose power consumption is suppressed in response to the gains are inserted. Accordingly, if the input terminal 52-i of the first input terminal group 53 and the output terminal 54-i of the first output terminal group 55 are directly connected to each other by switching among the signal routes by the signal switching circuit 51 described above, the then resulting gain is 0, but by selecting one of the input terminals 52-1, 52-2, 52-3, . . . which have different gains from each other by switching among the signal routes, the gain between the first input terminal group 53 and the first output terminal group 55 can be varied accordingly.

Figure 10:
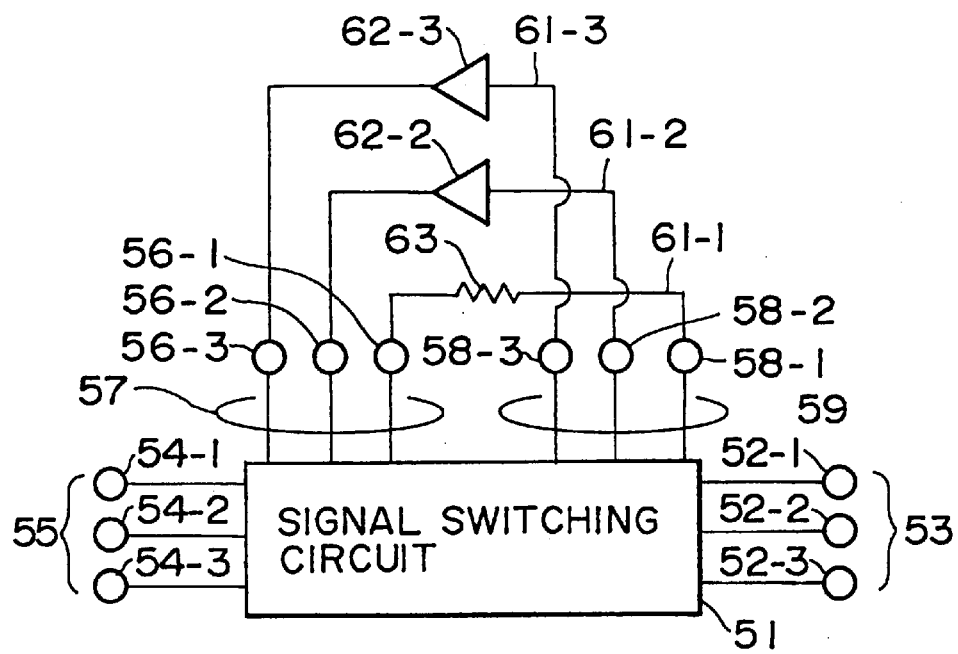
FIG. 10 is a block diagram of a modification to the signal processing circuit of FIG. 9.

It is to be noted that, while, in the present signal processing circuit, each of the first and second input terminal groups 53 and 57 and the first and second output terminal groups 55 and 59 is composed of a plurality of terminals, the number of terminals need not necessarily be a plural number, but at least one terminal may be involved. Where the number of terminals is 1, switching between two stages of whether the gain is 0 or an amplifier having a certain gain is selected is performed.

Where two or more routes are available for the internal connection between the first input terminal group 53 and the second output terminal group 59 selected in such a manner as described above, an attenuator 63 such as a resistor may be provided in at least one of the routes as seen in FIG. 10.

Figure 11:
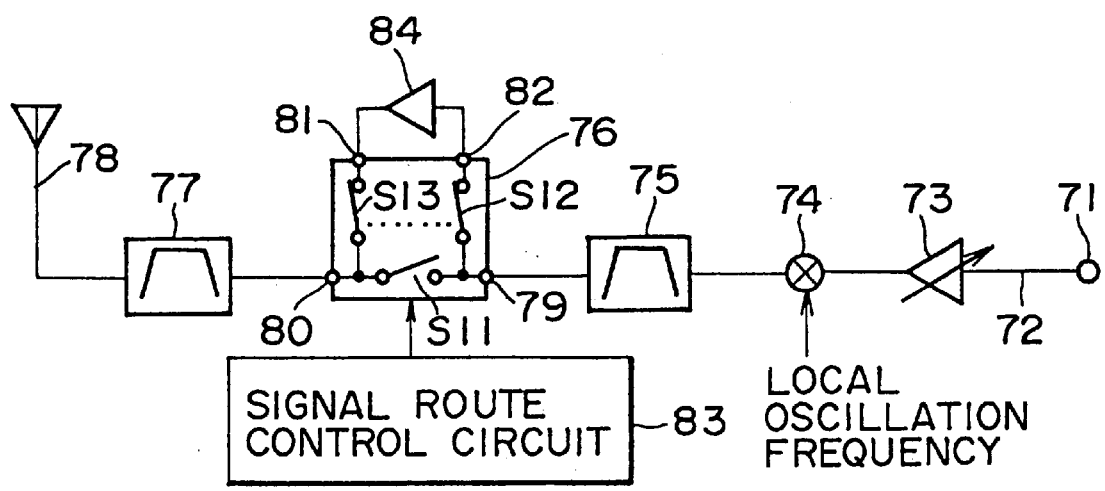
FIG. 11 is a block diagram of a transmission circuit of a radio communication system in which the signal processing circuit of FIG. 9 is incorporated.

FIG. 11 shows in block diagram a transmission circuit of a radio communication system, such as a cellular system, in which a gain adjustment element is divided in a plurality of elements and the signal processing circuit of the construction described above with reference to FIG. 9 is incorporated. It is to be noted that the signal processing circuit of the construction of FIG. 9 incorporated in the transmission circuit here includes one amplifier and has one input terminal and one output terminal.

Referring to FIG. 11, an IF signal of a fixed level inputted from a terminal 71 is supplied to a variable gain amplifier 73 through an IF signal line 72. The IF signal gain adjusted by the variable gain amplifier 73 is mixed with a local oscillation frequency by a frequency mixer 74 so that it is frequency converted into a RF signal. Then, unnecessary frequency components, such as an image signal are removed from the RF signal by a band-pass filter 75.

The RF signal having passed through the band-pass filter 75 subsequently passes through a signal switching circuit 76 and is then supplied to a transmission antenna 78 through a band-pass filter 77. The signal switching circuit 76 has a first input terminal 79, a first output terminal 80, a second input terminal 81 and a second output terminal 82 and is controlled to be switched by a signal route control circuit 83. An amplifier 84 having a predetermined gain is connected between the second output terminal 82 and the second input terminal 81 of the signal switching circuit 76.

Further, in the inside of the signal switching circuit 76, a switch S11 is connected between the first input terminal 79 and the first output terminal 80; another switch S12 is connected between the first input terminal 79 and the second output terminal 82; and a further switch S13 is connected to the second input terminal 81 and the first output terminal 80. A detailed internal circuit construction of the signal switching circuit 76 is hereinafter described.

In the transmission circuit having the construction described above with reference to FIG. 11, when a high output power is required for the transmission antenna 78, the switch S11 is put into an off-state while the switch S12 and S13 are put into an on-state by the signal switching circuit 76 to select the signal route of the amplifier 84. In any other case, the switch S11 is put into an on-state while the switch S12 and S13 are put into an off-state to directly connect the band-pass filter 75 and the band-pass filter 77 to each other.

Here, if the gain of the amplifier 84 is, for example, 20 dB, then a discrete gain variation between the gain of 0 in the case of direct connection and the fixed value (20 dB) of the gain of the amplifier 84 is provided by switching between the signal routes by the signal switching circuit 76. In this instance, since the variable gain amplifier 73 in the IF stage is an amplifier whose gain can be adjusted continuously, if the gain is continuously varied by the variable gain amplifier 73 to compensate for the discrete gain variation in the RF stage, then a desired gain can be obtained by a sum total of the gains by the two gain adjustment elements in the IF stage and the RF stage.

Figure 12:
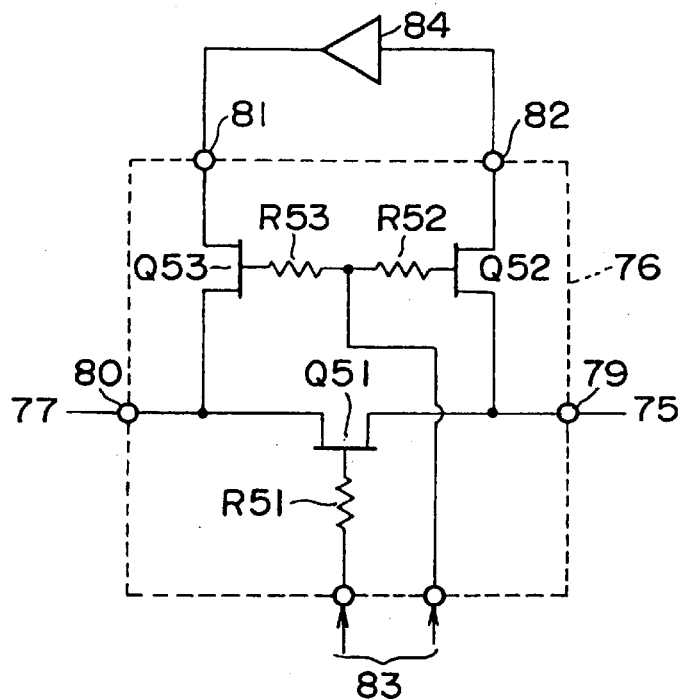
FIG. 12 is a circuit diagram of a signal switching circuit of the signal processing circuit of FIG. 11.

FIG. 12 is a circuit diagram showing a detailed internal circuit construction of the signal switching circuit 76. Referring to FIG. 12, as switching elements which form the switches S11, S12 and S13 of FIG. 11, for example, junction FETs Q51, Q52 and Q53 made of a chemical semiconductor such as GaAs are used. The gate electrodes of the junction FETs Q51 and Q52, Q53 are individually connected to receive on/off signals from the signal route control circuit 83 through resistors R51 and R52, R53, respectively.

The elements which form the signal switching circuit 76 described above are formed on a single semiconductor substrate (1 chip) as a monolithic microwave integrated circuit (MMIC) which handles a microwave. It is to be noted that, while, in the circuit construction shown in FIG. 12, junction FETs are used as switching elements which construct the switches S11, S12 and S13 of FIG. 11, it is otherwise possible to use MES-FETs (Metal Semiconductor Field Effect Transistors) or PIN diodes.

Since the signal switching circuit 76 for switching the gain is formed as a single switch in the form of an MMIC, the mounting area can be reduced, and reduction in number of parts and reduction in cost can be achieved. Further, since the length of the signal route for the gain of 0 can be reduced by forming the signal switching circuit 76 into an MMIC, when the gain of 0 is selected, the attenuation of a signal in the signal route can be suppressed substantially to 0.

Figure 13:
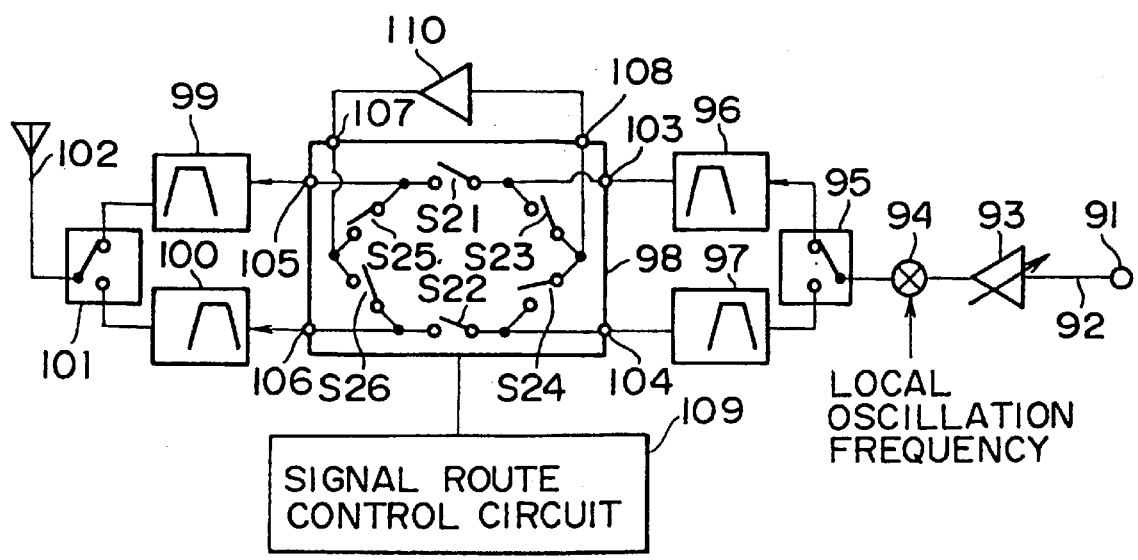
FIG. 13 is a block diagram of another transmission circuit of a radio communication system in which the signal processing circuit of FIG. 9 is incorporated.

FIG. 13 shows in block diagram another transmission circuit of a radio communication system such as a cellular system in which a gain adjustment element is divided in a plurality of elements and the signal processing circuit of the construction described above with reference to FIG. 9 is incorporated. It is to be noted that the signal processing circuit of the construction of FIG. 9 incorporated in the transmission circuit here includes one amplifier and has two input terminals and two output terminals.

Referring to FIG. 13, an IF signal of a fixed level inputted from a terminal 91 is supplied to a variable gain amplifier 93 through an IF signal line 92. The IF signal whose gain has been adjusted by the variable gain amplifier 93 is mixed with a local oscillation frequency by a frequency mixer 94 so that it is frequency converted into a RF signal. Thereafter, the RF signal is supplied to one of a band-pass filter 96 and another band-pass filter 97 having different pass-bands selected by an SPDT switch 95.

The RF signal having passed through the band-pass filter 96 or the band-pass filter 97 is then supplied to one of a band-pass filter 99 and another band-pass filter 100, which have different pass bands from each other, again selected by a signal switching circuit 98. The RF signal having passed through the band-pass filter 99 or the band-pass filter 100 is supplied to a transmission antenna 102 through an SPDT switch 101.

The signal switching circuit 98 has two first input terminals 103 and 104 and two first output terminals 105 and 106 as well as one second input terminal 107 and one second output terminal 108 and is controlled to be switched by a signal route control circuit 109. An amplifier 110 having a predetermined gain is connected between the second input terminal 107 and the second output terminal 108 of the signal switching circuit 98.

Further, in the inside of the signal switching circuit 98, switches S21 and S22 are connected between the first input terminals 103 and 104 and the first output terminals 105 and 106, respectively; switches S23 and S23 are connected between the first input terminals 103 and 104 and the second output terminal 108, respectively; and switches S25 and S26 are connected between the second input terminal 107 and the first output terminals 105 and 106, respectively. A detailed internal circuit construction of the signal switching circuit 98 is hereinafter described.

In the transmission circuit having the construction described above with reference to FIG. 13, selection of and amplification by the band-pass filters 96 and 99 or the band-pass filters 97 and 100 between the two systems based on a transmission frequency or selection of direct connection between the band-pass filter 96 and the band-pass filter 99 or between the band-pass filter 97 and the band-pass filter 100 is performed by the SPDT switch 95 or 101 or the signal switching circuit 98.

For example, when a high output power is required for the transmission antenna 102, the frequency mixer 94 and the band-pass filter 96 are connected to each other by the SPDT switch 95 while the band-pass filter 99 and the transmission antenna 102 are connected to each other by the SPDT switch 101. Further, the amplifier 110 is connected between the band-pass filter 96 and the band-pass filter 99 by the switches S21 to S26 in the inside of the signal switching circuit 98.

Also in the case of any other condition, switching of the signal route is performed similarly by the SPDT switches 95 and 101 and the switches S21 to S26 in the signal switching circuit 98. Also in gain switching by the signal switching circuit 98, a discrete gain variation between the gain of 0 in the case of direct connection and a fixed value in gain of the amplifier 110 is provided similarly as in the gain switching in the transmission circuit of FIG. 11. Accordingly, by varying the gain continuously by means of the variable gain amplifier 93 in the IF stage so that the discrete gain variation in the RF stage may be compensated for, a desired output power can be obtained.

Figure 14:
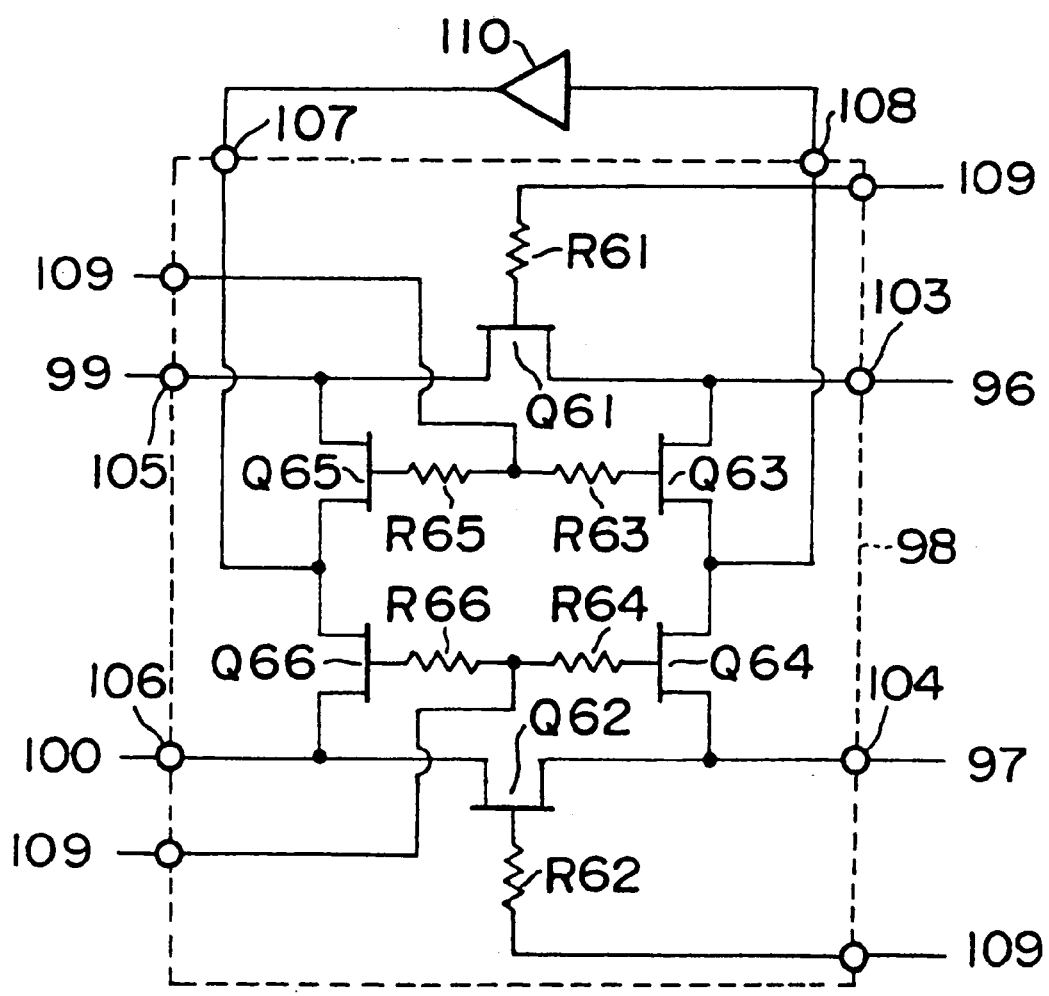
FIG. 14 is a circuit diagram of a signal switching circuit of the signal processing circuit of FIG. 13.

FIG. 14 shows in circuit diagram a detailed internal circuit construction of the signal switching circuit 98 described above. Referring to FIG. 14, as switching elements which form the switches S21 to S26 of FIG. 13, for example, junction FETs Q61 to Q66 made of a chemical semiconductor such as GaAs are used. The gate electrodes of the junction FETs Q61 to Q66 are individually connected to receive on/off signals from the signal route control circuit 109 through resistors R61 to R66, respectively.

The elements which form the signal switching circuit 98 described above are formed as an MMIC on one chip, similar to the transmission circuit of FIG. 11. It is to be noted that, while junction FETs are employed as switching elements which form the switches S21 to S26 of the transmission circuit of FIG. 13, the switching elements are not limited to them, and alternatively, MES-FETs or PIN diodes may be used.

FIG. 15 shows in block diagram a reception circuit of a radio communication system such as a cellular system in which a gain adjustment element is divided in a plurality of elements and the signal processing circuit of the construction described with reference to FIG. 9 is incorporated. It is to be noted that the signal processing circuit of the construction of FIG. 9 incorporated in the reception circuit here includes one amplifier and has one input terminal and one output terminal.

Referring to FIG. 15, a RF signal inputted from a reception antenna 121 first passes through a band-pass filter 122 and is supplied to another band-pass filter 124 through a signal switching circuit 123. The RF signal having passed through the band-pass filter 124 is mixed with a local oscillation frequency by a frequency mixer 125 so that it is frequency converted into an IF signal. Then, unnecessary frequency components such as an image signal are removed from the IF signal by a band-pass filter 126, and then the IF signal is gain adjusted by a variable gain amplifier 127. Then, the IF signal from the variable gain amplifier 127 is outputted from an output terminal 128 to a demodulator (not shown).

The signal switching circuit 123 has one first input terminal 130, one first output terminal 131, one second input terminal 132 and one second output terminal 133 and is controlled to be switched by a signal route control circuit 134. An amplifier 135 having a predetermined gain is connected between the second output terminal 133 and the second input terminal 132 of the signal switching circuit 123.

In the inside of the signal switching circuit 123, a switch S31 is connected between the first input terminal 130 and the first output terminal 131; another switch S32 is connected between the first input terminal 130 and the second output terminal 133; and a further switch S33 is connected between the second input terminal 132 and the first output terminal 131. For the signal switching circuit 123, the circuit having the circuit construction shown in FIG. 12 can be used as it is.

In the reception circuit having the construction described above with reference to FIG. 15, if a high disturbing wave in a received band is inputted to the reception antenna 121, then the signal switching circuit 123 puts the switch S31 into an on-state and puts the switches S32 and S33 into an off-state thereby to directly connect the band-pass filter 122 and the band-pass filter 124 to each other. On the other hand, if the receiving signal level is low, then the switch S31 is put into an off-state while the switches S32 and S33 are put into an on-state to select the signal route of the amplifier 135.

By the switching between the signal routes using the signal switching circuit 123, a discrete gain variation between the gain of 0 in the case of direct connection and a fixed value in gain of the amplifier 135 is provided. In this instance, since the variable gain amplifier 127 in the IF stage is an amplifier whose gain can be adjusted continuously, by varying the gain continuously by means of the variable gain amplifier 127 so that the discrete gain variation in the RF stage may be compensated for, a desired gain can be obtained by a sum of the gains of the two gain adjustment elements in the IF stage and the RF stage.

FIG. 16 shows in block diagram another reception circuit of a radio communication system, such as a cellular system in which a gain adjustment element is divided in a plurality of elements and the signal processing circuit of the construction described above with reference to FIG. 9 is incorporated. It is to be noted that the signal processing circuit of the construction of FIG. 9 incorporated in the reception circuit here includes one amplifier and has two input terminals and two output terminals.

Referring to FIG. 16, a RF signal inputted from a reception antenna 151 is supplied to one of a band-pass filter 153 and another band-pass filter 154 having different pass bands from each other selected by an SPDT switch 152. The RF signal having passed through the band-pass filter 153 or the band-pass filter 154 is switchably supplied to one of a band-pass filter 156 and another band-pass filter 157 having different pass bands from each other again by a signal switching circuit 155.

The RF signal having passed through the band-pass filter 156 or the band-pass filter 157 is supplied by an SPDT switch 158 to a frequency mixer 159, by which it is subsequently mixed with a local oscillation frequency so that it is frequency converted into an IF signal. Unnecessary frequency components, such as an image signal, are removed from the IF signal by a band-pass filter 160, and then gain adjustment of the IF signal is performed by a variable gain amplifier 161. Then, the IF signal from the variable gain amplifier 161 is outputted from an output terminal 162 to a demodulator (not shown).

The signal switching circuit 155 has two first input terminals 163 and 164 and two first output terminals 165 and 166 as well as one second input terminal 167 and one second output terminal 168, and is controlled to be switched by a signal route control circuit 169. An amplifier 170 having a predetermined gain is connected between the second output terminal 168 and the second input terminal 167 of the signal switching circuit 155.

Figure 1:
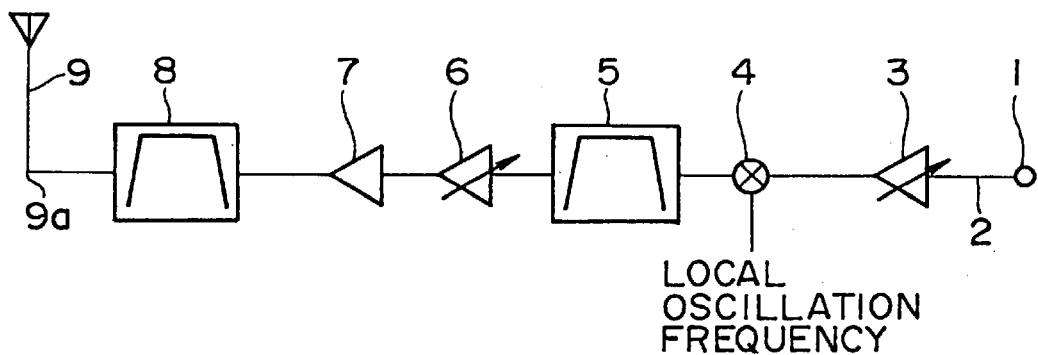
FIG. 1 is a block diagram showing a transmission system.
Figure 2:
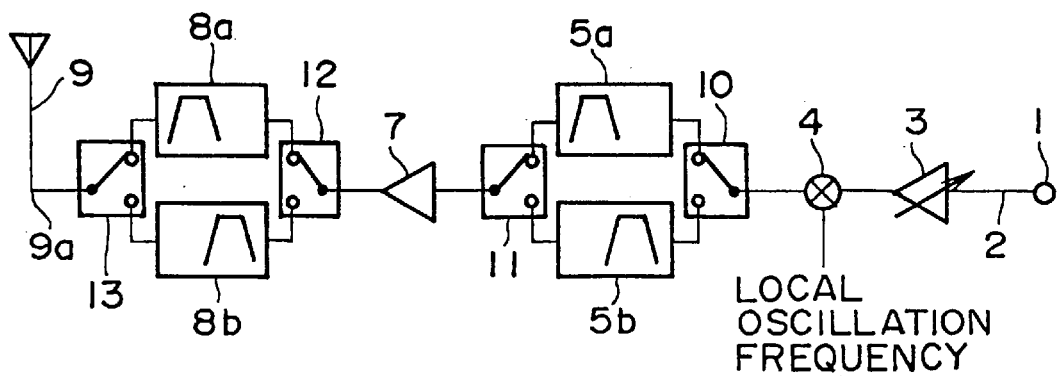
FIG. 2 is a block diagram showing another transmission system.
Figure 3:
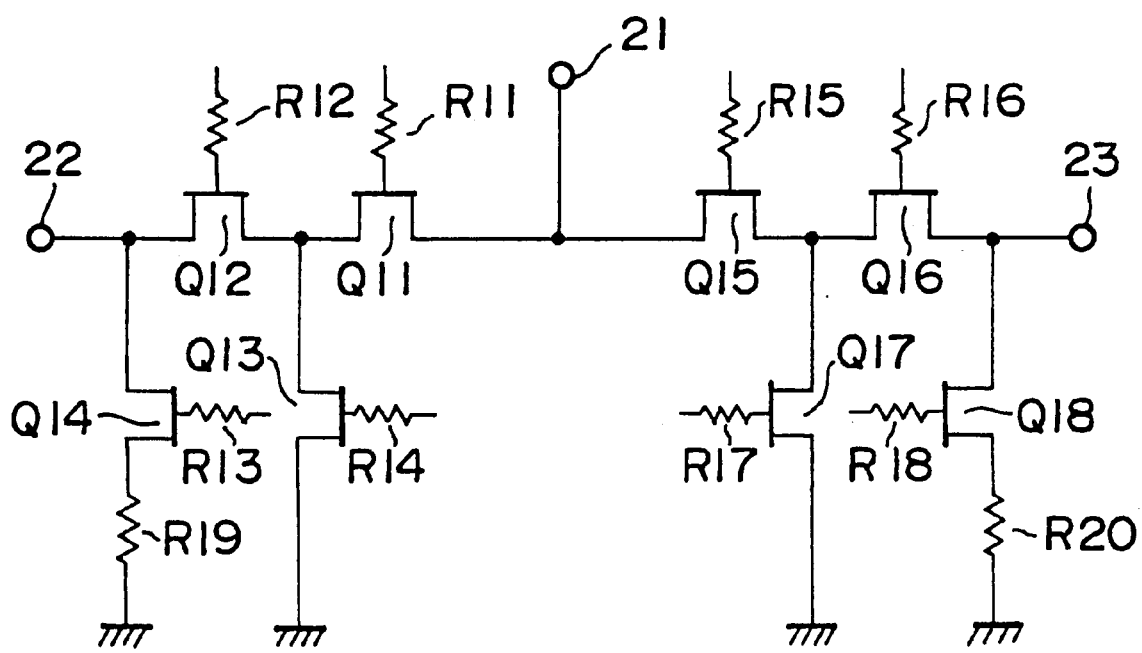
FIG. 3 is a circuit diagram of a switching circuit when mounted ideally.
Figure 4:
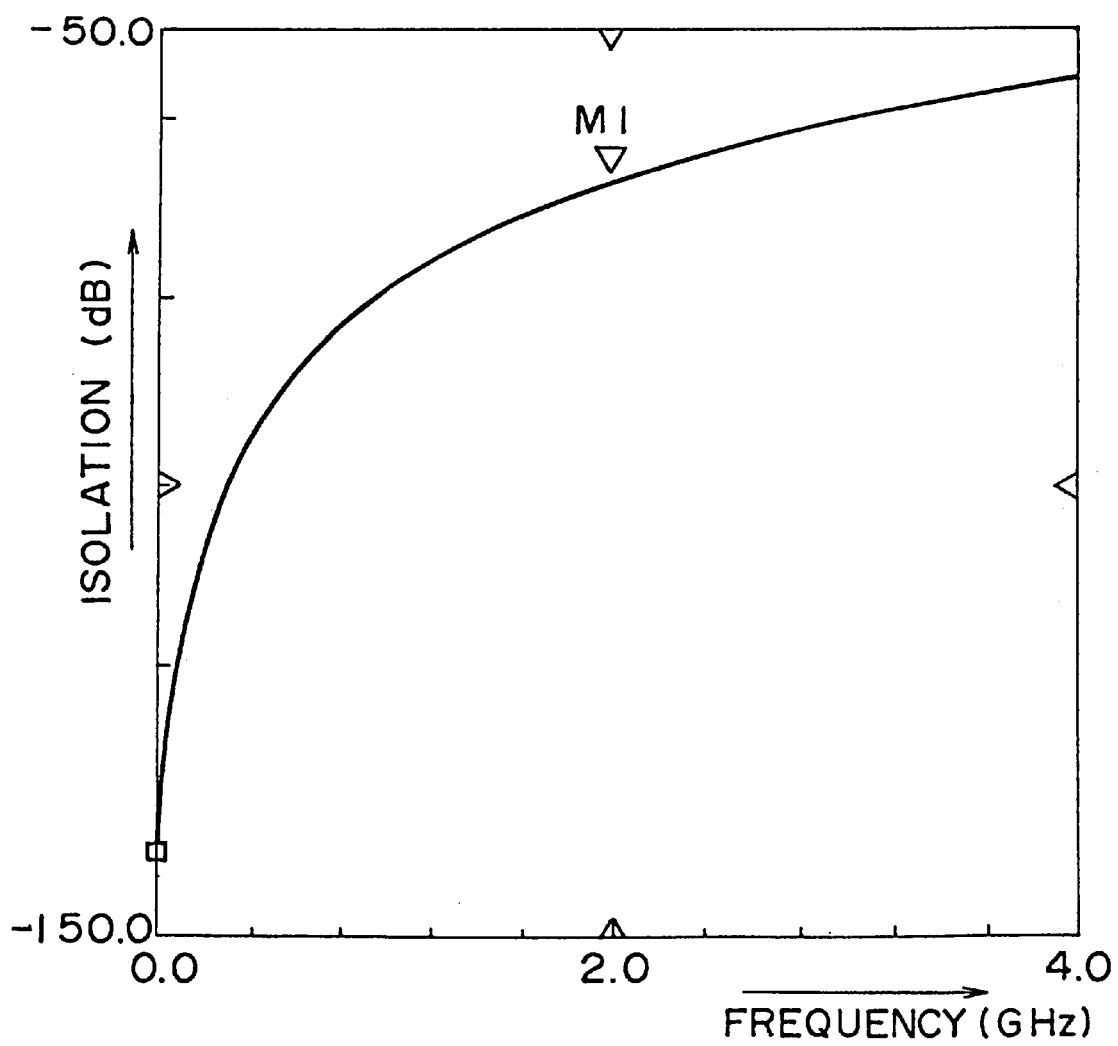
FIG. 4 is a diagram illustrating an isolation characteristic of the switching circuit shown in FIG. 3.
Figure 5:
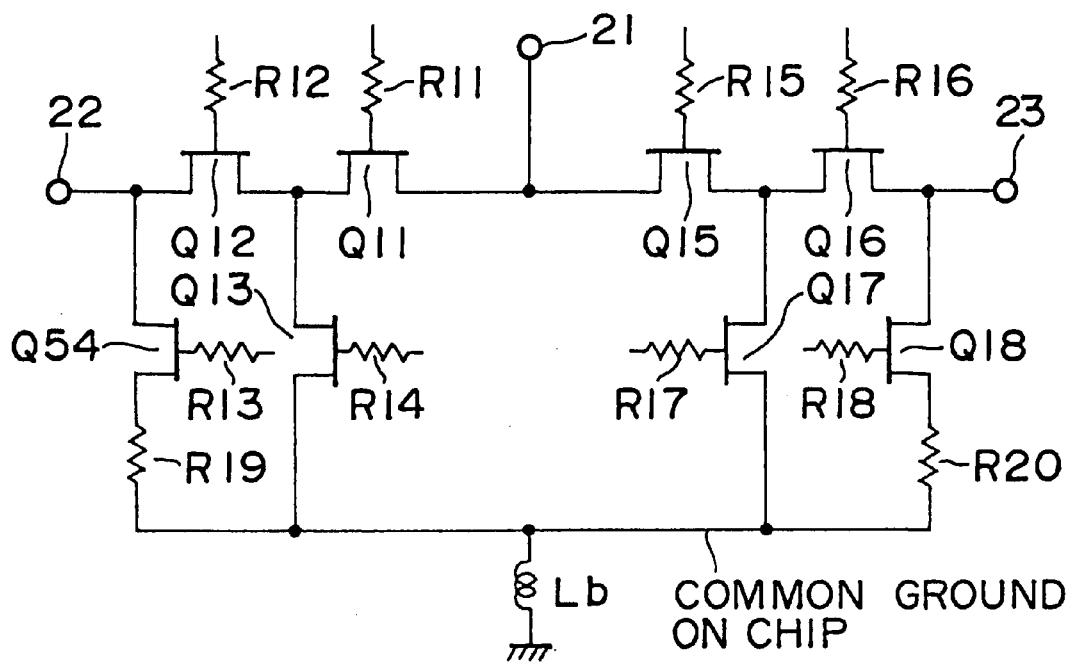
FIG. 5 is a circuit diagram of another switching circuit.
Figure 6:
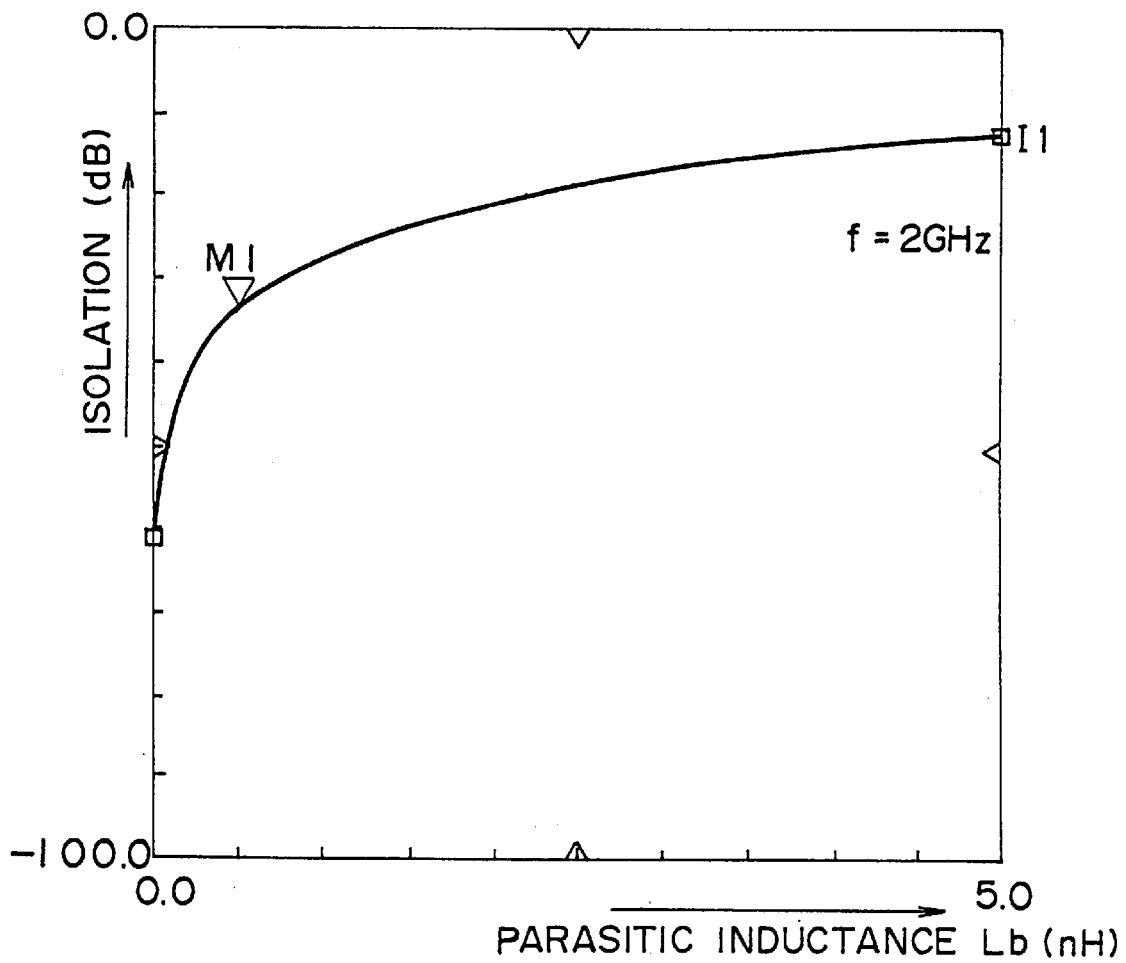
FIG. 6 is a diagram illustrating an isolation characteristic of the circuit shown in FIG. 5.
Figure 7:
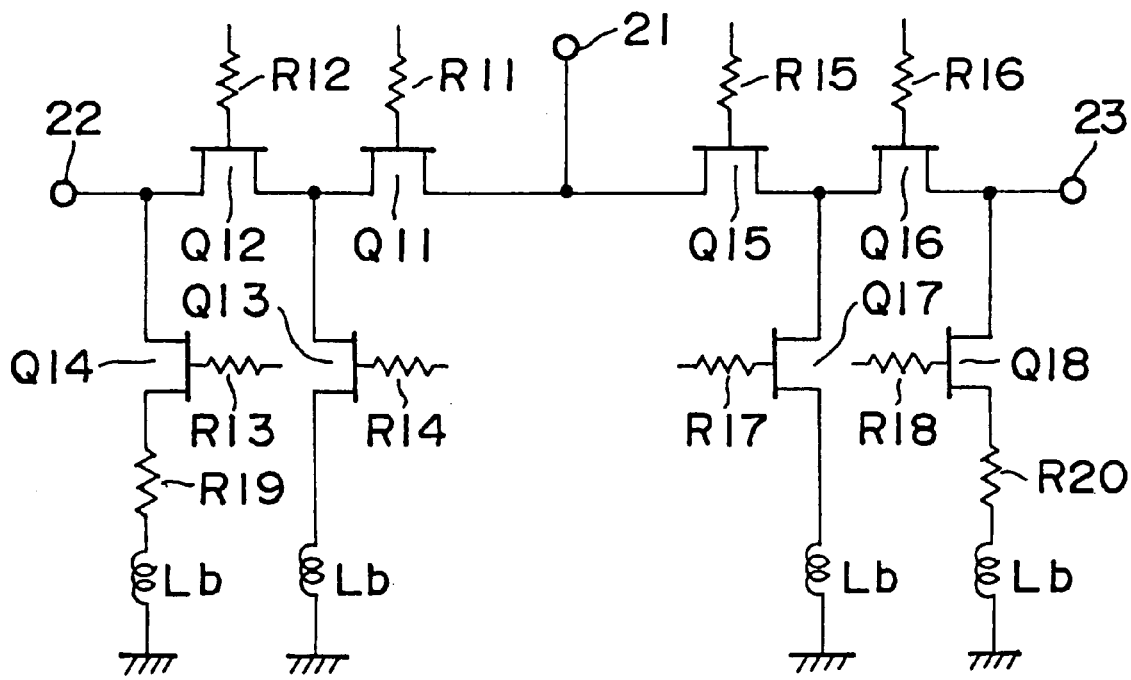
FIG. 7 is a circuit diagram of a further switching circuit.
Figure 8:
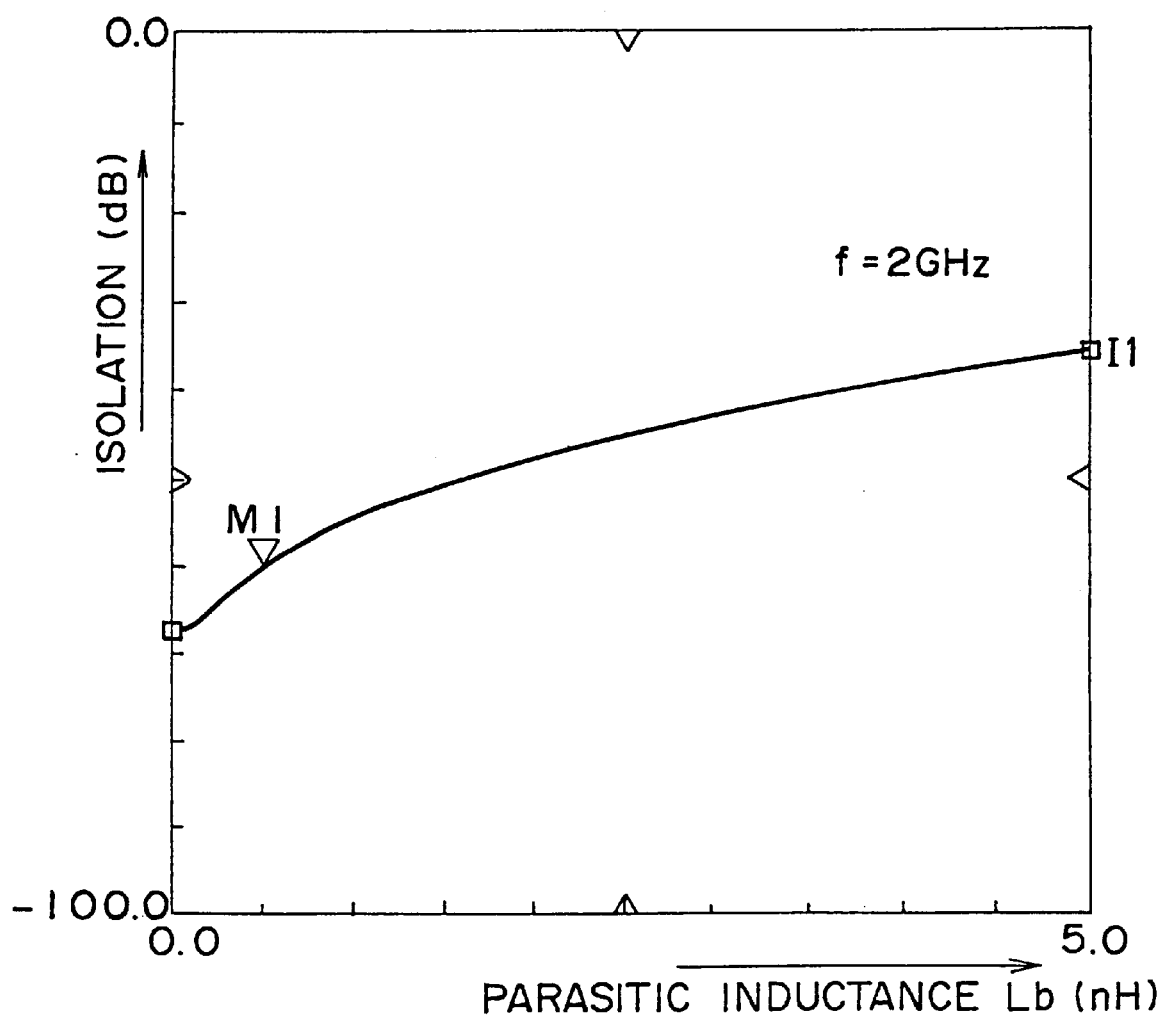
FIG. 8 is a diagram illustrating an isolation characteristic of the circuit shown in FIG. 7.

In the inside of the signal switching circuit 155, switches S41 and S42 are connected between the first input terminals 163 and 164 and the first output terminals 165 and 166, respectively; switches S43 and S44 are connected between the first input terminals 163 and 164 and the second output terminal 168, respectively; and switches S45 and S46 are connected between the second input terminal 167 and the first output terminals 165 and 166, respectively. For the signal switching circuit 155, a circuit having the circuit construction shown in FIG. 4 can be used as it is.

In the reception circuit having the construction described above with reference to FIG. 16, selection of and amplification by the band-pass filters 153 and 156 or the band-pass filters 154 and 157 between the two systems based on a reception frequency or selection of direct connection between the band-pass filter 153 and the band-pass filter 156 or between the band-pass filter 154 and the band-pass filter 157 is performed by the SPDT switch 152 or 158 or the signal switching circuit 155.

For example, if a high disturbing wave in a received band is generated, then the reception antenna 151 and the band-pass filter 153 are connected to each other by the SPDT switch 152, and the band-pass filter 156 and the frequency mixer 159 are connected to each other by the SPDT switch 158. Further, the band-pass filter 153 and the band-pass filter 156 are directly connected to each other by the switches S41 to S46 in the inside of the signal switching circuit 155.

Also in the case of any other condition, switching between the signal routes is performed similarly by the SPDT switches 152 and 158 and the switches S41 to S46 in the signal switching circuit 155. Also in gain switching by the signal switching circuit 155, a discrete gain variation between the gain of 0 in the case of direct connection and a fixed value in gain of the amplifier 170 is provided similarly as in the gain switching in the transmission circuit of FIG. 15. Accordingly, by varying the gain continuously by means of the variable gain amplifier 161 in the IF stage so that the discrete gain variation in the RF stage may be compensated for, a desired output power can be obtained.

As described above, according to the present invention, since, when a signal route whose gain is 0 or low is selected, any signal route other than the selected signal route is cut, power consumption of the entire system can be reduced significantly without deteriorating the effect of reduction of the dynamic range of an element in the signal route. Further, since means for performing switching of the gain can be constructed as a single switching means, reduction in mounting area, reduction in number of parts and reduction in cost can be achieved.

Further, a circuit where a filter is divided into a plurality filter elements, maintains the low loss performance without reducing the advantages of the circuit construction. Further, since an amplifier, which cannot conventionally be avoided to operate in an inefficient region, stops its operation in the inefficient region, the life of a battery for a terminal of a radio apparatus can be extended.

Figure 17:
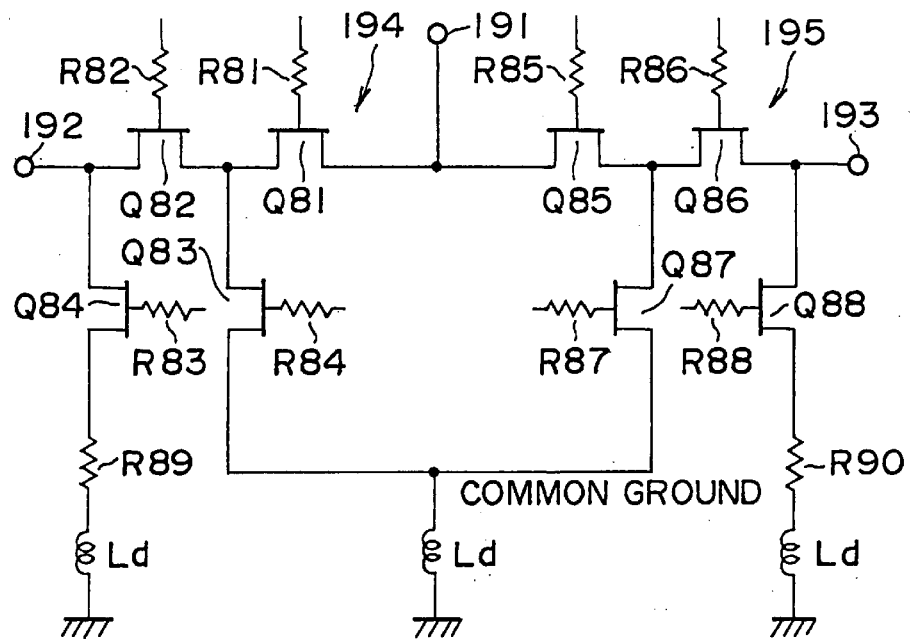
FIG. 17 is a circuit diagram of a signal switching circuit to which the present invention is applied.

Referring now to FIG. 17, there is shown a another switching circuit to which the present invention is applied. An FET Q81 and another FET Q82 are connected in series in a first signal route 194 between a first input/output terminal 191 and a second input/output terminal 192. A shunt FET Q83 is connected between a common junction between the FETs Q81 and Q82 and a common ground, and another shunt FET Q84 is connected in series to a resistor R89 for matching between the second input/output terminal 192 and the ground outside the IC. It is to be noted that a parasitic inductance Ld is provided between the resistor R89 and common ground and the ground outside the IC. Resistors R81 to R84 are connected to the gates of the FETs Q81 to Q84, respectively.

Similarly, an FET Q85 and another FET Q86 are connected in series in a second signal route 195 between the first input/output terminal 191 and a third input/output terminal 193. A shunt FET Q87 is connected between a common junction between the FETs Q85 and Q86 and the common ground, and another shunt FET Q88 is connected in series to a resistor R90 for matching between the third input/output terminal 193 and the ground outside the IC. It is to be noted that a parasitic inductance Ld is provided between the resistor R90 and the ground outside the IC. Resistors R85 to R88 are connected to the gates of the FETs Q85 to Q88, respectively.

In the switching circuit having the construction described above, for the FETs Q81, Q82, Q85 and Q86 and the shunt FETs Q83, Q84, Q87 and Q88 which serve as switching elements, for example, junction FETS made of gallium arsenite are used. Further, the junction FETs are formed as an MMIC together with the resistors R81 to R90 and so forth.

Here, in the first signal route 194, the series FET Q81 and the shunt FET Q83 are paired with each other, and the series FET Q82 and the shunt FET Q84 are paired with each other. Similarly, in the second signal route 195, the series FET Q85 and the shunt FET Q87 are paired with each other, and the series FET Q86 and the shunt FET Q88 are paired with each other.

Figure 18:
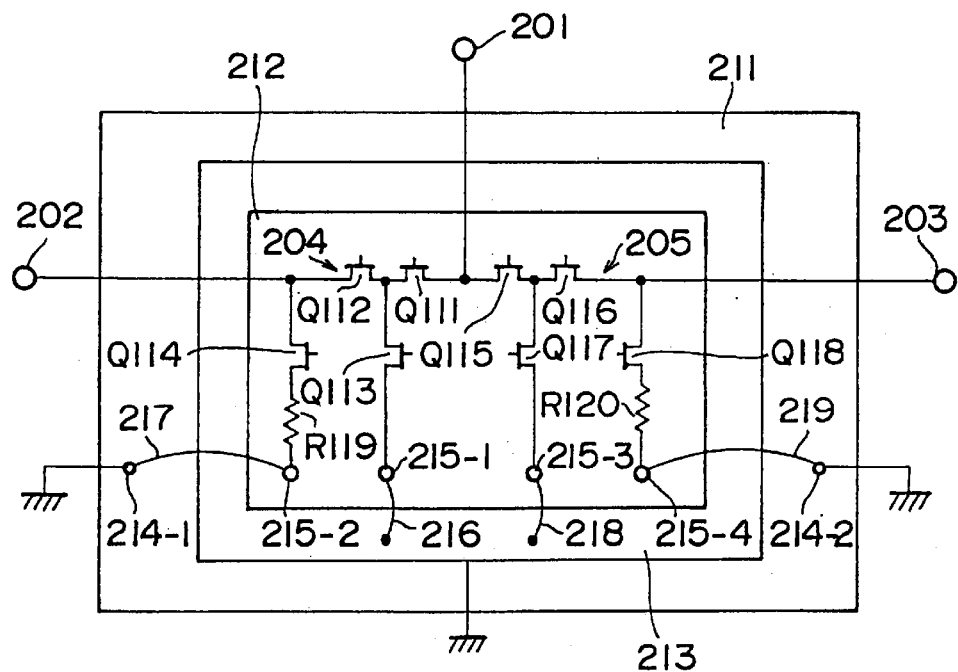
FIG. 18 is a circuit diagram showing a mounting structure of a switching IC of the signal switching circuit of FIG. 17.

FIG. 18 is a diagrammatic view illustrating a concept of a mounting structure of the switching IC having the construction described above with reference to FIG. 17. Referring to FIG. 18, a die pad 213 which carries an IC chip 212 thereon is mounted in an IC package 211 and connected to the ground outside the IC. The IC package 211 has, for example, two first ground terminals (pins) 214-1 and 214-2 connected to the ground outside the IC.

Further, the IC chip 212 has, for example, four first to fourth grounds 215-1 to 215-4. The first ground 215-1 is connected to the die pad 213 by a wire 216. The second ground 215-2 is connected to the first ground terminal 214-1 on the IC package 211 by a wire 217. The third ground 215-3 is connected to the die pad 213 by a wire 218. The fourth ground 215-4 is connected to the second ground terminal 214 on the IC package 211 by a wire 219.

On the IC chip 212, the drain/source of a shunt FET Q113 on the first signal route 204 side is connected to the first ground 215-1. The drain/source of a shunt FET Q114 is connected to the second ground 215-2 through a resistor R119. Similarly, the drain/source of a shunt FET Q117 on the second signal route 205 side is connected to the third ground 215-3, and the drain/source of a shunt FET Q118 is connected to the fourth ground 215-4 through a resistor R120.

In the switching circuit having the construction described above with reference to FIG. 18, when the first signal route 204 between a first input/output terminal 201 and a second input/output terminal 202 is to be rendered conducting, series FETs Q111 and Q112 and the shunt FETS Q117 and Q118 are put into an on-state while the shunt FETs Q113 and Q114 and series FETs Q115 and Q116 are input into an off-state. Since the series FETs Q111 and Q112 are in an on-state, the first signal route 204 exhibits no loss, and since the shunt FETs Q113 and Q114 are in an off-state, a small signal leaks from the signal route to the ground. Accordingly, the route between the first input/output terminal 201 and the second input/output terminal 202 is put into a conducting state.

Meanwhile, in the second signal route 205 between the first input/output terminal 201 and a third input/output terminal 203, since the series FETs Q115 and Q116 are in an off-state, the route itself is in a non-conducting state. Here, if the signal frequency increases, then a signal leaks through off capacitances of the series FETs Q115 and Q116. However, since the shunt FET Q117 is in an on-state, the signal leaking from the series FET Q115 is pulled to the ground through the shunt FET Q117, and consequently, a high isolation can be assured. Further, the shunt FET Q187, which is in an on-state, pulls in a signal leaking from the FET Q116 and acts to improve the isolation.

Figure 19:
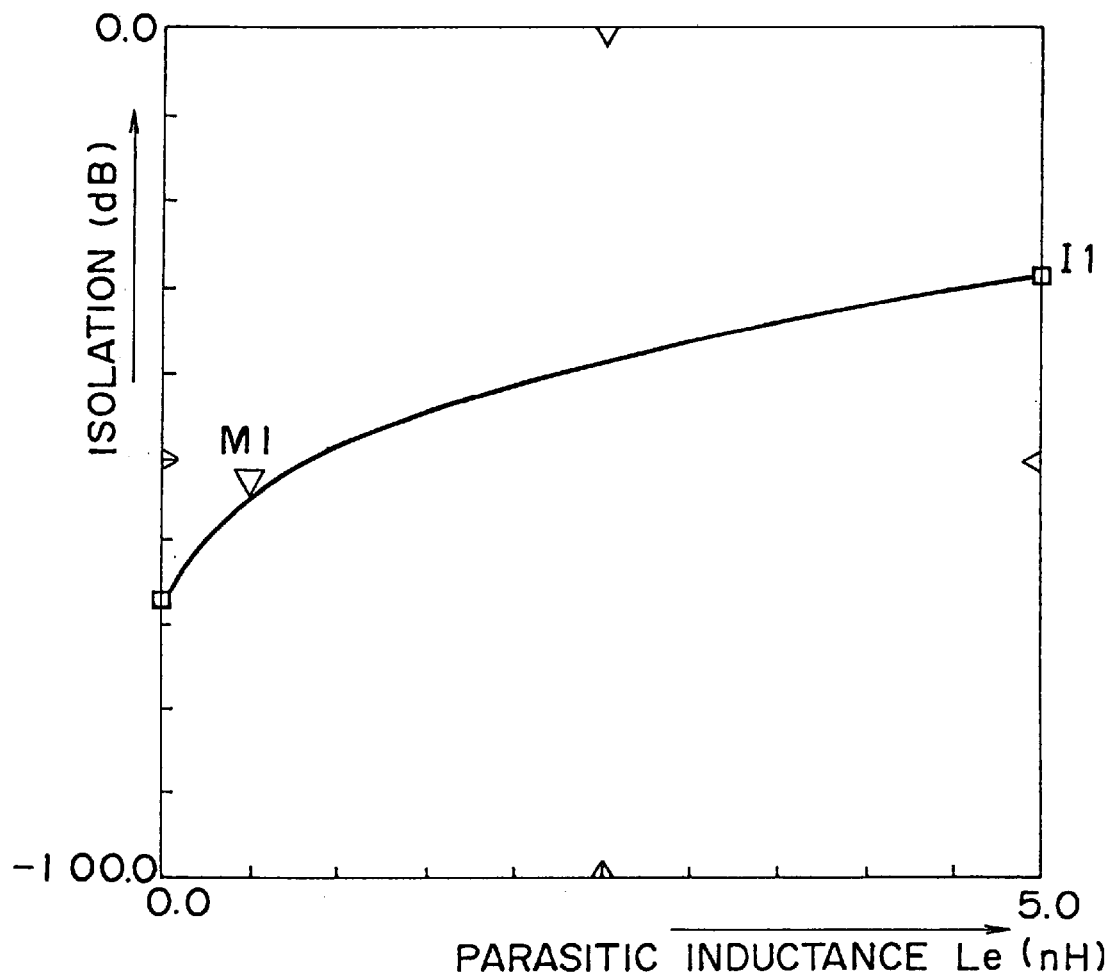
FIG. 19 is a diagram illustrating an isolation characteristic of the signal switching circuit shown in FIG. 18.

As described above, in the first and second signal routes 204 and 205, since the ground sides of the shunt FETs Q113 and Q117 on the first input/output terminal 201 side are connected to the die pad 213 by the wires 216 and 218, respectively, the lengths of the wires 216 and 218 can be made short, and consequently, a parasitic inductance Le can be reduced. As a result, a high isolation can be achieved. FIG. 19 illustrates the isolation characteristic. It can be seen from FIG. 19 that a considerably high isolation has been realized. For example, even where the parasitic inductance Le of the wire is 0.5 nH, an isolation of approximately 55 dB can be realized.

Further, since the ground sides of the shunt FETS Q114 and Q118 on the second and third input/output terminals 202 and 203 sides are connected to the first and second ground terminals 214-1 and 214-2 on the IC package 211 by the wires 217 and 219, respectively, drawing around of a signal from an insufficient ground is prevented, which prevents deterioration of the isolation characteristic. Besides, since the ground sides of all of the shunt FETs are not connected to I/O pins of the IC package 211, the number of pins can be reduced, which can contribute to minimization of the IC package 211.

Figure 20:
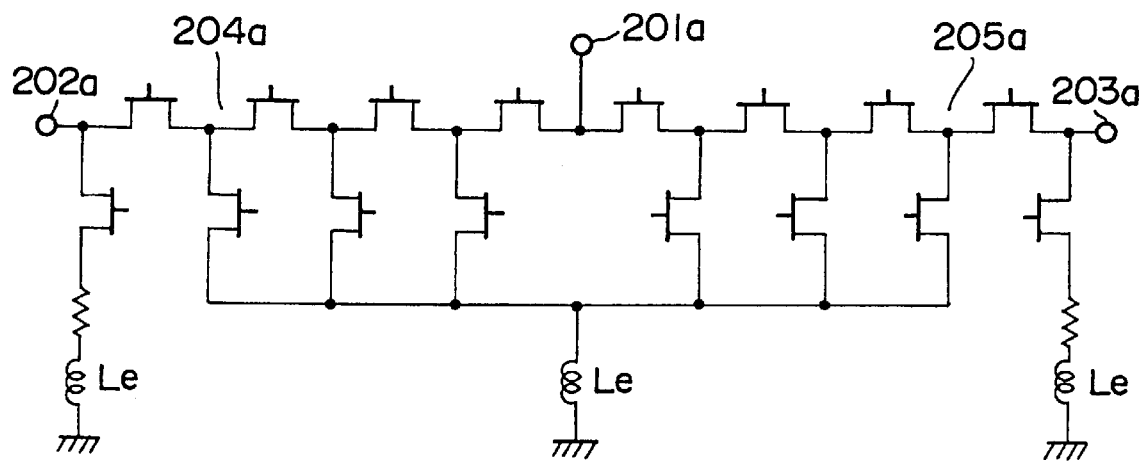
FIG. 20 is a circuit diagram showing a modification to the signal switching circuit of FIG. 17.

It is to be noted that, while the switching circuit described above with reference to FIG. 18 includes two pairs of series FETs and shunt FETs provided in each signal route, it may alternatively include three or more such pairs. FIG. 20 shows a circuit diagram of a switching circuit wherein four pairs of series FETs and shunt FETs are provided. In this instance, if the ground sides of the series FETs in the three pairs on a first input/output terminal 201a side are connected to a common ground on a die pad, similar effects to those of the switching circuit of FIG. 18 described above are exhibited. It is to be noted that the ground sides of all of the three pairs on the first input/output terminal 201a side need not necessarily be connected to the common ground, but it is required that at least one of them be connected to the common ground.

Further, while the switching circuit described above with reference to FIG. 20 has two signal routes of a first signal route 204a between the first input/output terminal 201a and a second input/output terminal 202a and a second signal route 205a between the first input/output terminal 201a and a third input/output terminal 203a, the number of signal routes is not limited to two, but three or more signal routes which commonly include the first input/output terminal 201a may be provided.

Figure 21:
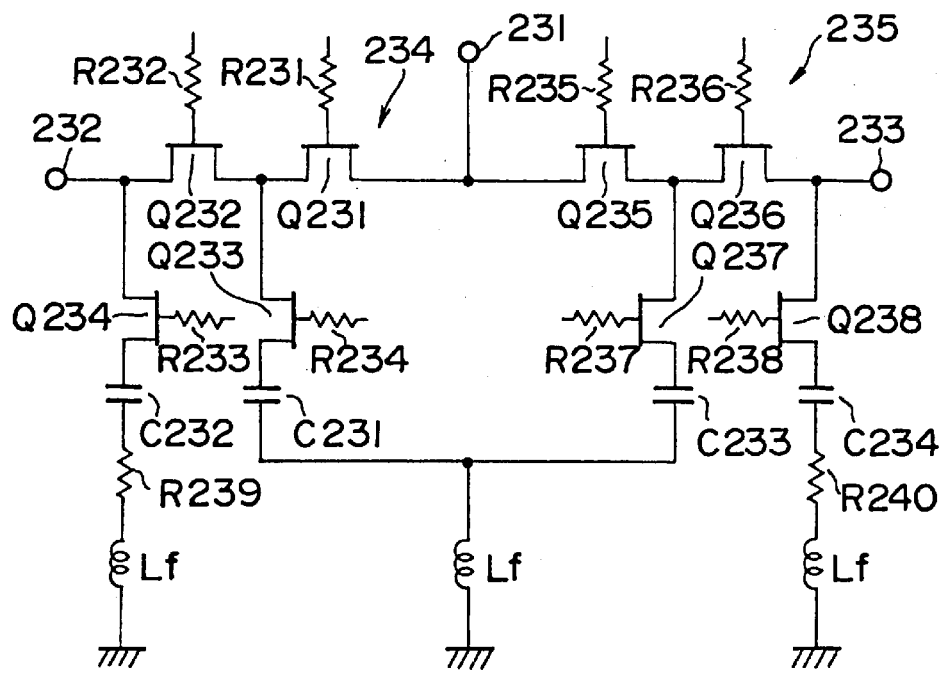
FIG. 21 is a circuit diagram of another modification to the signal switching circuit of FIG. 17.

By the way, in order to drive an FET of GaAs, a negative power supply is usually required. Thus, if a switching circuit is constructed such that, as shown in FIG. 21, capacitors C231, C232, C233 and C234 are interposed between shunt FETs Q233, Q234, Q237 and Q238, which are disposed between signal routes 234 and 235 and the ground, and the ground, the switch IC can be isolated with respect to dc current, and consequently, the FETs of GaAs can be controlled only with a positive power supply.

As described above, according to the present invention, since the ground sides of first and third switching elements on the first input/output terminal sides in first and second signal routes are connected to the common ground on a chip and the ground sides of second and fourth switching elements on the second and third input/output terminal sides are connected to the ground outside the IC, the lengths of wires for connecting the ground sides of the first and third switching elements to a die pad can be set short and the number of pins of the IC package can be reduced. Besides, since no drawing around of a signal from an insufficient ground occurs, even where an inexpensive plastic mold packet is used, a switching IC having a very high isolation characteristic can be realized, and both reduction in cost and reduction in size of the IC can be achieved.

Having now fully described the invention, it will be apparent to one of ordinary skill in the art that many changes and modifications can be made thereto without departing from the spirit and scope of the invention as set forth herein.

What is claimed is:

1. A signal processing unit comprising:
    signal switching means including
        a first input terminal group including one or more input terminals,
        a first output terminal group including one or more output terminals in a one-to-one correspondence with each of the input terminals of said first input terminal group,
        a second input terminal group including one or more input terminals,
        a second output terminal group including one or more output terminals in a one-to-one correspondence with each of the input terminals of said second input terminal group,
        a first switch for selectively connecting one or more of the input terminals of said first input terminal group and one of the output terminals of said first output terminal group,
        a second switch for selectively connecting one of the input terminals of said first input terminal group and one of the output terminals of said second output terminal group, and
        a third switch for selectively connecting one of the input terminals of said second input terminal group and one of the output terminals of said first output terminal group;
    signal path control means for controlling on/off-states of said first, second and third switches; and
    two or more signal paths, at least a first signal path having an amplifier such that the signal paths have different gains from each other, to connect one of the output terminals of said second output terminal group and one of the input terminals of said second input terminal group.

2. The signal processing circuit according to claim 1, wherein said first, second and third switches are field effect transistors.

3. The signal processing circuit according to claim 2, wherein said first, second and third switches are formed on a single semiconductor substrate.

4. The signal processing circuit according to claim 1, wherein the signal switching means, the signal path control means, and the signal paths are used to adjust a gain in a transmission circuit that transmits a signal of a high frequency.

5. The signal processing circuit according to claim 1, wherein the signal switching means, the signal path control means, and the signal paths are used to adjust a gain in a reception circuit that receives a signal of a high frequency.

6. The switching circuit according to claim 1, further comprising an attenuator disposed in at least a second signal path of said two or more signal paths.

7. A switching circuit formed as an IC, comprising:

first, second and third input/output terminals;

a first signal route including two or more switching elements connected in series between said first and second input/output terminals;

a second signal route including two or more switching elements connected in series between said first and third input/output terminals;

a first grounded switching element connected from a junction in between said switching elements of said first signal route to a common ground on the IC;

a second grounded switching element connected from said second input/output terminals to to an outside ground located outside the IC;

a third grounded switching element connected from a junction in between said switching elements of said second signal route to said second signal route and the common ground; and a fourth grounded switching element connected between from said third input/output terminals to said third input/output terminal and the outside ground.

8. The switching circuit according to claim 7, wherein the switching elements in said first and second signal routes and said first, second, third and fourth grounded switching elements are field effect transistors of gallium arsenite.

9. The switching circuit according to claim 8, wherein the switching elements in said first and second signal paths and said first, second, third and fourth grounded switching elements are junction type field effect transistors.

10. The switching circuit according to claim 7, further comprising resistors inserted between said second and fourth grounded switching elements and the outside ground.

11. The switching circuit according to claim 8, further comprising capacitors inserted between said first, second, third and fourth grounded switching elements and one of the common ground and the outside ground.

* * * * *